United States Patent
Kawaguchi

(10) Patent No.: US 8,258,201 B2
(45) Date of Patent: *Sep. 4, 2012

(54) PHOTOCURABLE COMPOSITION AND PROCESS FOR PRODUCING MOLDED PRODUCT HAVING FINE PATTERN ON ITS SURFACE

(75) Inventor: Yasuhide Kawaguchi, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/888,936

(22) Filed: Sep. 23, 2010

(65) Prior Publication Data

US 2011/0020617 A1 Jan. 27, 2011

Related U.S. Application Data

(63) Continuation of application No. PCT/JP2009/058943, filed on May 13, 2009.

(30) Foreign Application Priority Data

May 29, 2008 (JP) ................................. 2008-140764

(51) Int. Cl.
*C08F 2/50* (2006.01)
*C08J 3/28* (2006.01)

(52) U.S. Cl. ........ 522/100; 522/102; 522/103; 522/113; 522/114; 522/131; 522/120; 522/121; 522/130; 522/132; 522/178; 522/181; 522/182; 522/184; 522/186; 522/187; 522/155; 522/156; 522/153; 264/494; 264/496

(58) Field of Classification Search .................. 522/109, 522/110, 111, 112, 113, 114, 120, 121, 130, 522/131, 132, 178, 182, 184, 186, 187, 100, 522/172; 156/496; 264/496, 494

See application file for complete search history.

(56) References Cited

U.S. PATENT DOCUMENTS

| 6,303,730 | B1 | 10/2001 | Fries et al. |
| 6,696,220 | B2 | 2/2004 | Bailey et al. |
| 7,441,745 | B2 | 10/2008 | Kawaguchi et al. |
| 7,767,309 | B2 | 8/2010 | Ueno et al. |
| 7,935,472 | B2 * | 5/2011 | Ogino et al. ............... 430/270.1 |
| 2007/0065757 | A1 * | 3/2007 | Ogino et al. ................. 430/311 |
| 2008/0107870 | A1 * | 5/2008 | Kawaguchi et al. .......... 428/156 |
| 2009/0302507 | A1 | 12/2009 | Tsunozaki et al. |
| 2010/0038831 | A1 | 2/2010 | Kawaguchi et al. |

FOREIGN PATENT DOCUMENTS

| JP | 2004-51790 | | 2/2004 |
| JP | 2004051790 | A * | 2/2004 |
| JP | 2004-071934 | | 3/2004 |
| JP | 2006-327990 | | 12/2006 |
| WO | WO9700276 | * | 1/1997 |
| WO | 2006/112234 | | 10/2006 |
| WO | 2006/114958 | | 11/2006 |

OTHER PUBLICATIONS

U.S. Appl. No. 13/151,324, filed Jun. 2, 2011, Kawaguchi.
Extended European Search Report issued on Sep. 7, 2011 in the corresponding European Application No. 09754569.3.

* cited by examiner

*Primary Examiner* — Sanza McClendon
(74) *Attorney, Agent, or Firm* — Oblon, Spivak, McClelland, Maier & Neustadt, L.L.P.

(57) ABSTRACT

To provide a photocurable composition whereby it is possible to obtain a cured product provided with both release property and high refractive index, and a process whereby it is possible to produce a molded product having a high refractive index and having on its surface a fine pattern having a reverse pattern of a mold precisely transferred. The photocurable composition comprising from 61 to 90 mass % of a compound (A) having a refractive index of at least 1.55 at a wavelength of 589 nm before curing and having at least two (meth) acryloyloxy groups, from 2 to 15 mass % of a compound (B) having fluorine atoms and at least one carbon-carbon unsaturated double bond (provided that compound (A) is excluded), from 5 to 35 mass % of a compound (C) having one (meth)acryloyloxy group (provided that compound (B) is excluded), and from 1 to 12 mass % of a photopolymerization initiator (D) (provided (A)+(B)+(C)+(D)=100 mass %).

20 Claims, 2 Drawing Sheets

PHOTOCURABLE COMPOSITION AND PROCESS FOR PRODUCING MOLDED PRODUCT HAVING FINE PATTERN ON ITS SURFACE

TECHNICAL FIELD

The present invention relates to a photocurable composition and a process for producing a molded product having a fine pattern on its surface.

BACKGROUND ART

In the production of optical components, recording media, semiconductor devices, etc., as a method for forming a fine pattern in a short time, a method for forming a fine pattern on the surface of a substrate (nanoimprinting method) is known wherein a mold having on its surface a reverse pattern of such a fine pattern, is pressed to a photocurable composition placed on the surface of a substrate, and the photocurable composition is irradiated with light to cure the photocurable composition thereby to form a fine pattern on the surface of the substrate (Patent Documents 1 and 2).

However, in such a method, the cured product of the photocurable composition adheres to the mold, whereby it is difficult to separate the cured product from the mold. Therefore, it is necessary to apply a release agent to the surface of the mold. However, it becomes difficult to precisely transfer the reverse pattern of the mold due to the film thickness of the release agent itself, the fluctuation in application of the release agent, etc.

The following one has been proposed as a photocurable composition capable of forming a cured product having a good release property.

(1) A photocurable composition comprising a fluorinated monomer, a monomer containing no fluorine, a fluorinated surfactant or fluorinated polymer, and a polymerization initiator (Patent Document 3).

Meanwhile, in an application to an optical component (such as a lens array or a photonic crystal), the refractive index may sometimes be required to be at least 1.54. However, the photocurable composition of (1) contains a fluoromonomer having a low refractive index, whereby it is difficult to obtain a cured product which has a high refractive index and a good release property.

CITATION LIST

Patent Document

Patent Document 1: U.S. Pat. No. 6,696,220
Patent Document 2: JP-A-2004-071934
Patent Document 3: WO2006/114958

SUMMARY OF INVENTION

Technical Problem

The present invention is to provide a photocurable composition whereby it is possible to obtain a cured product provided with both release property and high refractive index, and a process whereby it is possible to produce a molded product having a high refractive index and having on its surface a fine pattern having a reverse pattern of a mold precisely transferred.

Solution to Problem

The photocurable composition of the present invention comprises a compound (A) having a refractive index of at least 1.55 at a wavelength of 589 nm before curing and having at least two (meth)acryloyloxy groups, a compound (B) having fluorine atoms and at least one carbon-carbon unsaturated double bond (provided that the compound (A) is excluded), a compound (C) having one (meth)acryloyloxy group (provided that the compound (B) is excluded), and a photopolymerization initiator (D), wherein in the total (100 mass %) of the compound (A), the compound (B), the compound (C) and the photopolymerization initiator (D), the compound (A) is from 61 to 90 mass %, the compound (B) is from 2 to 15 mass %, the compound (C) is from 5 to 35 mass %, and the photopolymerization initiator (D) is from 1 to 12 mass %.

The photocurable composition of the present invention may further contain a fluorinated surfactant (E) in addition to the above compounds (A) to (C) and photopolymerization initiator (D).

The photocurable composition of the present invention preferably contains substantially no solvent.

The photocurable composition of the present invention preferably has a refractive index of at least 1.54 at a wavelength of 589 nm after curing.

The present invention provides a process for producing a molded product having a fine pattern on its surface, which comprises a step of bringing the photocurable composition of the present invention in contact with a surface of a mold, having a reverse pattern of said fine pattern, a step of irradiating the photocurable composition with light in such a state that the photocurable composition is in contact with the surface of the mold, to cure the photocurable composition to form a cured product, and a step of separating the mold from the cured product to obtain a molded product having a fine pattern on its surface The present invention provides a process for producing a molded product having a fine pattern on its surface, which comprises a step of placing the photocurable composition of the present invention on a surface of a substrate, a step of pressing a mold having a reverse pattern of said fine pattern on its surface against the photocurable composition so that the reverse pattern of the mold is in contact with the photocurable composition, a step of irradiating the photocurable composition with light in such a state that the mold is pressed against the photocurable composition, to cure the photocurable composition to form a cured product, and a step of separating the mold, or the mold and the substrate, from the cured product to obtain a molded product having a fine pattern on its surface.

The present invention provides a process for producing a molded product having a fine pattern on its surface, which comprises a step of placing the photocurable composition of the present invention on a surface of a mold, having a reverse pattern of said fine pattern, a step of pressing a substrate against the photocurable composition, a step of irradiating the photocurable composition with light in such a state that the substrate is pressed against the photocurable composition, to cure the photocurable composition to form a cured product, and a step of separating the mold, or the substrate and the mold, from the cured product to obtain a molded product having a fine pattern on its surface.

The present invention provides a process for producing a molded product having a fine pattern on its surface, which comprises a step of bringing a substrate and a mold having a reverse pattern of said fine pattern on its surface to be close to or in contact with each other, so that the reverse pattern of the mold is on the substrate side, a step of filing the photocurable composition of the present invention between the substrate and the mold, a step of irradiating the photocurable composition with light in such a state that the substrate and the mold are close to or in contact with each other, to cure the photocurable composition to form a cured product, and a step of separating the mold, or the substrate and the mold, from the cured product to obtain a molded product having a fine pattern on its surface.

Further, in each of the processes for producing a molded product having a fine pattern on its surface according to the present invention, the light used for curing the photocurable composition preferably has a wavelength of from 200 to 500 nm.

Advantageous Effects of Invention

By the photocurable composition of the present invention, it is possible to obtain a cured product provided with both release property and high refractive index.

By each process for producing a molded product having a fine pattern on its surface according to the present invention, it is possible to produce a molded product having a high refractive index, which has on its surface a fine pattern having a reverse pattern of a mold precisely transferred.

DESCRIPTION OF EMBODIMENTS

Figure 1:
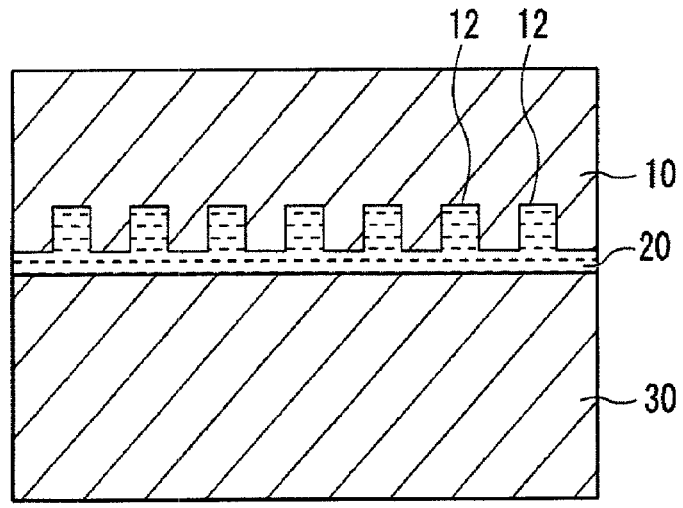
FIG. 1 is a cross-sectional view illustrating an embodiment of the process for producing a molded product having a fine pattern on its surface.

In the present specification, a compound represented by the formula (B1) will be referred to as a compound (B1). Compounds represented by other formulae will also be referred to in the same manner. Further, in the present specification, a (meth)acryloyloxy group means an acryloyloxy group or a methacryloyloxy group. Further, in the present specification, a (meth)acrylate means an acrylate or a methacrylate.

<Photocurable Composition>

The photocurable composition of the present invention is a composition comprising the compounds (A) to (C) and the photopolymerization initiator (D), and it may contain a fluorinated surfactant (E) and an additive (F) as the case requires.

Compound (A): A compound having a refractive index of at least 1.55 at a wavelength of 589 nm before curing and having at least two (meth)acryloyloxy groups.

Compound (B): A compound having fluorine atoms and at least one carbon-carbon unsaturated double bond (provided that the compound (A) is excluded).

Compound (C): A compound having one (meth)acryloyloxy group (provided that the compound (B) is excluded).

The viscosity at 25° C. of the photopolymerizable composition of the present invention is preferably from 200 to 1,000 mPa·s, more preferably from 300 to 600 mPa·s. When the viscosity of the photopolymerizable composition is within such a range, the contact of the photopolymerizable composition with the surface having a reverse pattern of a mold can easily be carried out without carrying out any special operation (such as an operation to heat the photocurable composition at a high temperature to make the viscosity low).

The photocurable composition of the present invention preferably contains substantially no solvent. When the photocurable composition contains substantially no solvent, curing of the photocurable composition can easily be carried out without carrying out any special operation (such as an operation to heat the photocurable composition at a high temperature to remove the solvent) other than irradiation with light.

The solvent is a compound having an ability to dissolve any of the compounds (A) to (C), photopolymerization initiator (D), fluorinated surfactant (E) and additive (F).

"Contains substantially no solvent" means that no solvent is contained at all, or a solvent to be used at the time of preparing the photocurable composition may be contained as a residual solvent. However, the residual solvent is preferably removed as far as possible and is preferably at most 10 mass % in the photocurable composition (100 mass %).

The sensitivity of the photocurable composition of the present invention may be represented by the integrated quantity of light until the photocurable composition is completely cured when the photocurable composition having a thickness of about 1.5 μm is irradiated with light from a high pressure mercury lamp (a light source having main wavelengths of 254 nm, 315 nm and 365 nm at from 1.5 to 2.0 kHz). The integrated quantity of light is preferably at most 1,000 mJ/cm$^2$, more preferably from 150 mJ/cm$^2$ to 750 mJ/cm$^2$. If the integrated quantity of light exceeds 1,000 mJ/cm$^2$, it takes a time of at least 20 seconds to cure the photopolymerizable composition, whereby the production efficiency tends to be poor.

The photocurable composition of the present invention preferably has a refractive index of at least 1.54, more preferably from 1.54 to 1.62, at a wavelength of 589 nm after curing. If such a refractive index is less than 1.54, the focal distance cannot be substantially reduced, whereby the size of an optical element such as a microlens array cannot be reduced.

The refractive index at a wavelength of 589 nm of the photocurable composition after curing, is measured at 23° C. by using an Abbe refractometer.

The contact angle to water after curing of the photocurable composition of the present invention serves as an index for the release property of the cured product. Such a contact angle is preferably at least 75°, more preferably from 80 to 116°. If the contact angle is less than 75°, releasing tends to be difficult, and the photocurable composition tends to adhere to the mold, whereby the mold is likely to break. The contact angle is measured in accordance with JIS R3257.

(Compound (A))

The compound (A) is a compound having a refractive index of at least 1.55 at a wavelength of 589 nm before curing and having at least two (meth)acryloyloxy groups.

The refractive index at a wavelength of 589 nm of the compound (A) before curing is at least 1.55, preferably from 1.55 to 1.63. If the refractive index is less than 1.55, it will be impossible to obtain a cured product of the photocurable composition having a refractive index of at least 1.54 at a wavelength of 589 nm.

The refractive index at a wavelength of 589 nm of the compound (A) before curing, is measured at 23° C. by using an Abbe refractometer.

The compound (A) is preferably liquid, and the viscosity at 25° C. of the compound (A) is preferably at most 10 Pa·s, particularly preferably at most 1 Pa·s. If the viscosity exceeds 10 Pa·s, the compound (A) may not be uniformly mixed with the compound (B) and the compound (C), whereby the trans parency is likely to deteriorate, and the composition may not be used for an optical application. In the present specification, it is preferred to measure the viscosity by using a viscometer (TV-20, manufactured by TOKI SANGYO CO., LTD.) already corrected by a standard liquid (JS50 (33.17 mPa·s at 25° C.)).

The compound (A) may, for example, be an aromatic compound having at least two benzene rings and having at least two (meth)acryloyloxy groups. Such at least two benzene rings may form a condensed ring (such as a naphthalene ring, an anthracene ring or a fluorene ring).

The aromatic compound having at least two benzene rings may, for example, be a compound having a bisphenol skeleton, a compound having a naphthalene skeleton, a compound having an anthracene skeleton and a compound having a fluorene skeleton, represented by the following formulae (A1) to (A7).

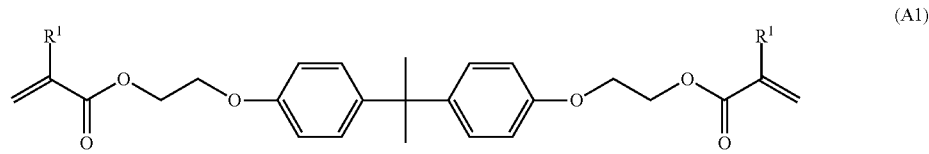
(A1)

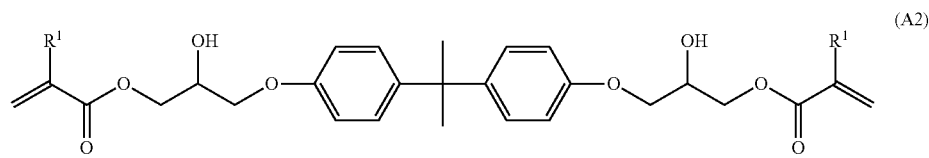
(A2)

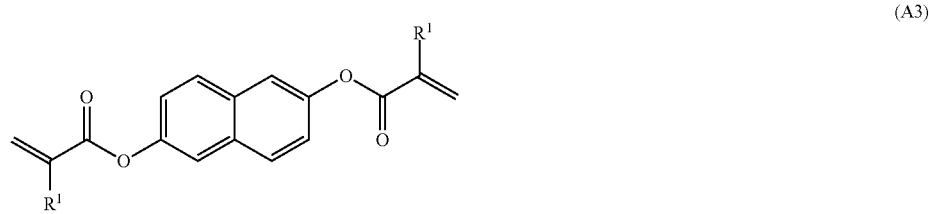
(A3)

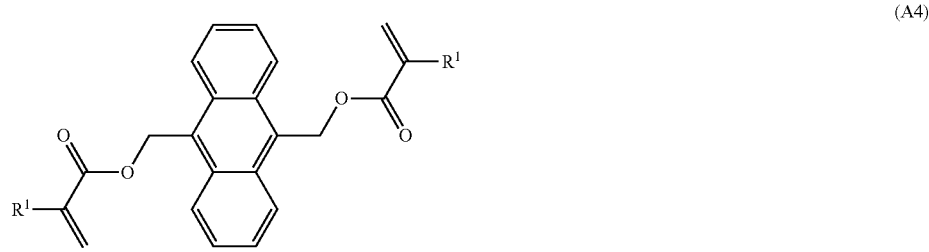
(A4)

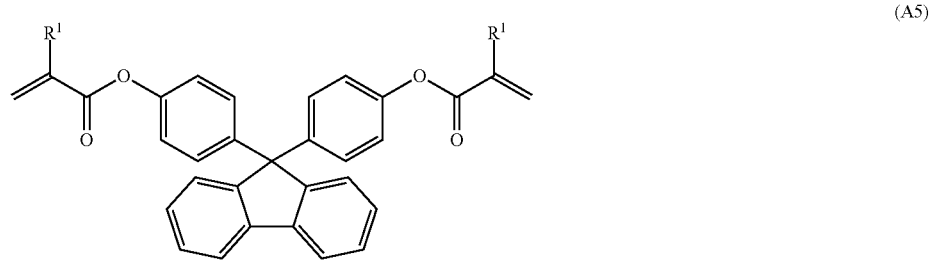
(A5)

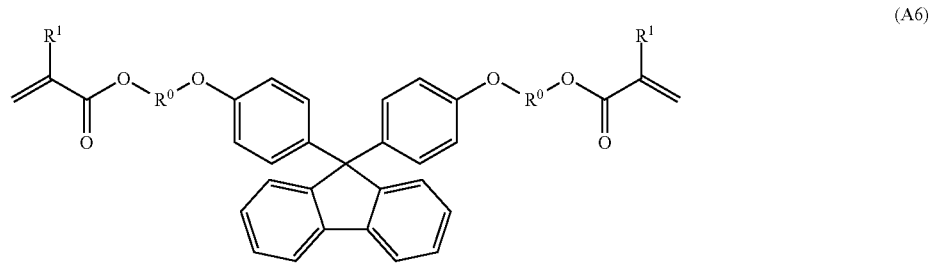
(A6)

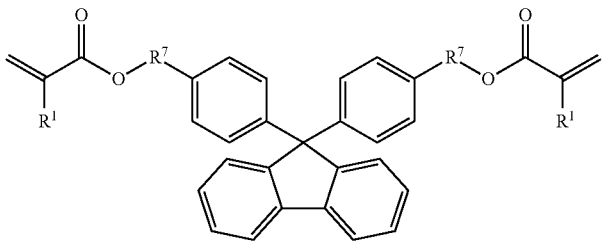

(A7)

wherein $R^1$ is a hydrogen atom or a methyl group, $R^0$ is a $C_{1-5}$ alkyl group, $R^7$ is a $C_{1-5}$ alkyl group, $(CH_2CH_2O)_p$ or $(CH_2CH_2CH_2O)_q$, p is an integer of from 1 to 4, and q is an integer of from 1 to 4.

As the compound (A), a compound having a fluorene skeleton is particularly preferred from the viewpoint of a high refractive index and compatibility.

The compound having a fluorene skeleton may, for example, be di(meth)acrylate compounds having a fluorene skeleton represented by the formulae (A5) to (A7). Commercial products of the compound having a fluorene skeleton may, for example, be OGSOL EA-F5003 (manufactured by Osaka Gas Chemicals) and NK ester A-BPEF (manufactured by SHIN-NAKAMURA CHEMICAL CO., LTD.).

As the compound (A), one type may be used alone, or two or more types may be used in combination.

The content of the compound (A) is from 61 to 90 mass %, preferably from 63 to 80 mass %, in the total (100 mass %) of the compound (A), the compound (B), the compound (C) and the photopolymerization initiator (D). When the content of the compound (A) is at least 61 mass %, it is possible to obtain a cured product of the photocurable composition having a refractive index of at least 1.54 at a wavelength of 589 nm. When the content of the compound (A) is at most 90 mass %, the cured product is free from phase separation.

(Compound (B))

The compound (B) is a compound having fluorine atoms and at least one carbon-carbon unsaturated double bond (provided that the compound (A) is excluded).

The compound (B) may, for example, be a fluoro(meth) acrylate, a fluorodiene, a fluorovinyl ether or a fluorocyclic monomer. From the viewpoint of the compatibility, a fluoro (meth)acrylate is preferred.

As the compound (B) is contained in the photocurable composition of the present invention, releasing can easily be carried out at the time of separating the cured photocurable composition from the mold.

The viscosity at 25° C. of the compound (B) is preferably at most 300 mPa·s, particularly preferably at most 150 mPa·s. If the viscosity exceeds 300 mPa·s, the compound (B) may not be uniformly mixed with the compound (A) and the compound (C), and the transparency tends to deteriorate, whereby the composition may not be useful for an optical application.

The fluoro(meth)acrylate is preferably a compound (B1):

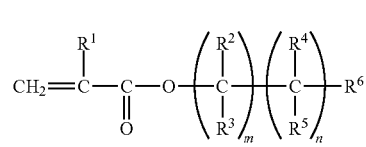

(B1)

wherein $R^1$ is a hydrogen atom or a methyl group, each of $R^2$ and $R^3$ which are independent of each other, is a hydrogen atom or a $C_{1-4}$ alkyl group, each of $R^4$ and $R^5$ which are independent of each other, is a fluorine atom or a $C_{1-4}$ perfluoroalkyl group, $R^6$ is a hydrogen atom or a fluorine atom, m is an integer of from 1 to 4, and n is an integer of from 1 to 16. From the viewpoint of the compatibility, n is preferably an integer of from 1 to 10. m is preferably an integer of from 1 to 2.

As the fluoro(meth)acrylate, the following compounds may preferably be used.
3-(Perfluoro-3-methylbutyl)-2-hydroxybutyl(meth)acrylate,
2,2,2-trifluoro-1-(trifluoromethyl)ethyl(meth)acrylate,
$CH_2$=$CHCOOCH_2CF_2OCF_2CF_2OCF_3$,
$CH_2$=$CHCOOCH_2CF_2O(CF_2CF_2O)_3CF_3$,
$CH_2$=$C(CH_3)COOCH_2CF_2OCF_2CF_2OCF_3$,
$CH_2$=$C(CH_3)COOCH_2CF_2O(CF_2CF_2O)_3CF_3$,
$CH_2$=$CHCOOCH_2CF(CF_3)OCF_2CF(CF_3)O(CF_2)_3F$,
$CH_2$=$CHCOOCH_2CF(CF_3)O(CF_2CF(CF_3)O)_2(CF_2)_3F$,
$CH_2$=$C(CH_3)COOCH_2CF(CF_3)OCF_2CF(CF_3)O(CF_2)_3F$,
$CH_2$=$C(CH_3)COOCH_2CF(CF_3)O(CF_2CF(CF_3)O)_2(CF_2)_3F$,
$CH_2$=$CFCOOCH_2CH(OH)CH_2(CF_2)_6CF(CF_3)_2$,
$CH_2$=$CFCOOCH_2CH(CH_2OH)CH_2(CF_2)_6CF(CF_3)_2$,
$CH_2$=$CFCOOCH_2CH(OH)CH_2(CF_2)_{10}F$,
$CH_2$=$CFCOOCH_2CH(CH_2OH)CH_2(CF_2)_{10}F$,
$CH_2$=$CHCOOCH_2CF_2(OCF_2CF_2)_n$
  $OCF_2CH_2OCOCH$=$CH_2$
(wherein n is an integer of from 4 to 20), etc.

As the fluoro(meth)acrylate, the following compounds are particularly preferred from the viewpoint of the compatibility and environmental characteristics:
  $CH_2$=$CHCOO(CH_2)_2(CF_2)_{10}F$,
  $CH_2$=$CHCOO(CH_2)_2(CF_2)_8F$,
  $CH_2$=$CHCOO(CH_2)_2(CF_2)_6F$,
  $CH_2$=$C(CH_3)COO(CH_2)_2(CF_2)_{10}F$,
  $CH_2$=$C(CH_3)COO(CH_2)_2(CF_2)_8F$,
  $CH_2$=$C(CH_3)COO(CH_2)_2(CF_2)_6F$,
  $CH_2$=$CHCOOCH_2(CF_2)_6F$, $CH_2=C(CH_3)COOCH_2(CF_2)_6F$,
$CH_2=CHCOOCH_2(CF_2)_7F$,
$CH_2=C(CH_3)COOCH_2(CF_2)_7F$,
$CH_2=CHCOOCH_2CF_2CF_2H$,
$CH_2=CHCOOCH_2(CF_2CF_2)_2H$,
$CH_2=CHCOOCH_2(CF_2CF_2)_4H$,
$CH_2=C(CH_3)COOCH_2(CF_2CF_2)H$,
$CH_2=C(CH_3)COOCH_2(CF_2CF_2)_2H$,
$CH_2=C(CH_3)COOCH_2(CF_2CF_2)_4H$.

As a fluorodiene, the compound (B2) is preferred.

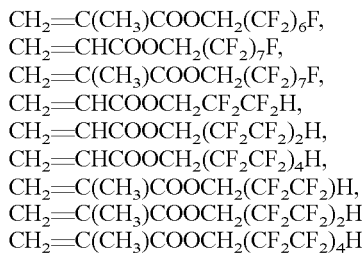
(B2)

wherein each of $R^8$ and $R^9$ which are independent of each other, is a hydrogen atom, a fluorine atom, a $C_{1-3}$ alky group or a $C_{1-3}$ fluoroalkyl group, Q is an oxygen atom or a group represented by $—NR^{10}—$ ($R^{10}$ is a hydrogen atom, a $C_{1-6}$ alkyl group, an alkylcarbonyl group or a tosyl group), or a bivalent organic group which may have a functional group (such as $—OCF_2CF(O(CF_2)_3PO(OC_2H_5)_2)CH_2—$, $—CH_2CH(C(CF_3)_2OH)CH_2—$, $—CH_2CH(C(CF_3)_2OH)—$, $—CH_2CH(C(CF_3)_2OH)CH_2CH_2—$, $—CH_2CH(CH_2C(CF_3)_2$ $OH)CH_2CH_2—$, $—CH_2C(CH_3)(CH_2SO_2F)CH_2—$, $—CF_2C(CF_3)(OCH_2OCH_2CF_3)CH_2—$, $—OCF_2CF(OCF_2CF_2SO_2F)CH_2—$, $—OCF_2CF(OCF_2CF_2CH_2NH_2)CH_2—$, $—OCF_2CF(O(CF_2)_3CN)—$, $—OCF_2CF(OCF_2CF_2CH_2NH_2)CH_2—$, $—CF_2C(CF_3)(OH)—$, $—CF_2C(CF_3)(OH)CH_2—$, $—CF_2C(CF_3)(OH)—$, $—OCF_2CF(O(CF_2)_3OC_2H_5)CH_2—$, $—CF_2C(CF_3)(OCH_2OCH_3)CH_2—$, $—CH_2CH(CH_2C(CF_3)_2OH)CH_2—$, or $—CH_2CH(CH_2C(CF_3)_2OH)$).

As a fluorodiene, the following compounds are particularly preferred from the viewpoint of the compatibility and environmental characteristics.

$CF_2=CFCF_2C(CF_3)(OH)CH=CH_2$,
$CF_2=CFCF_2C(CF_3)(OH)CH_2CH=CH_2$,
$CF_2=CFCF_2C(CF_3)(OCH_2OCH_2CF_3)CH_2CH=CH_2$,
$CF_2=CFCF_2C(CF_3)(OCH_2OCH_3)CH_2CH=CH_2$.

As the compound (B), one type may be used alone, or two or more types may be used in combination.

The content of the compound (B) is from 2 to 15 mass %, preferably from 4 to 10 mass %, in the total (100 mass %) of the compound (A), the compound (B), the compound (C) and the photopolymerization initiator (D). When the content of the compound (B) is at least 2 mass %, it is possible to obtain a cured product excellent in release property, and further, it is possible to suppress foaming of the photocurable composition. As foaming of the photocurable composition can be suppressed, filtration becomes easy during the preparation, and further, it is possible to eliminate a defect in the pattern shape due to inclusion of foams during nanoimprinting. When the content of the compound (B) is at most 15 mass %, mixing can be carried out uniformly, whereby it is possible to obtain a cured product excellent in mechanical strength, and further, it is possible to suppress lowering of the refractive index at a wavelength of 589 nm of the cured product of the photocurable composition to a level of less than 1.54.

(Compound (C))

The compound (C) is a compound having one (meth)acryloyloxy group (provided that the compound (B) is excluded).

The compound (C) is a component to let another component dissolve and to improve the compatibility of the compound (A) with the compound (B). When the compatibility of the compound (A) with the compound (B) is good, it is possible to suppress foaming at the time of preparation of a photocurable composition and to facilitate filtration through the filter, whereby the preparation of the photocurable composition will be facilitated, or a uniform photocurable composition can be obtained. Further, as a homogeneous cured product is obtainable, the release property and mechanical strength may be sufficiently provided.

The viscosity at 25° C. of the compound (C) is preferably at most 300 mPa·s, particularly preferably at most 150 mPa·s. If the viscosity exceeds 300 mPa·s, it tends to be difficult to uniformly mix the compound (A) with the compound (B), whereby the transparency is likely to deteriorate, such being not suitable for an optical application.

As the compound (C), the following compounds may be mentioned.

Phenoxyethyl(meth)acrylate, 2-hydroxy-3-phenoxypropyl(meth)acrylate, phenoxyethylene glycol (meth)acrylate, phenoxydiethylene glycol (meth)acrylate, benzyl (meth)acrylate, methoxytriethylene glycol (meth)acrylate, methoxypolyethylene glycol (meth)acrylate, 2-(meth)acryloyloxyethyl hexahydrophthalic acid, behenyl (meth)acrylate, 2-((meth)acryloyloxyethyl succinic acid, stearyl(meth)acrylate, isostearyl(meth)acrylate, lauryl(meth)acrylate, 2-ethylhexyl(meth)acrylate, 3-(trimethoxysilyl)propyl(meth)acrylate, butyl(meth)acrylate, methoxyethyl(meth)acrylate, glycidyl(meth)acrylate, tetrahydrofurfuryl(meth)acrylate, allyl(meth)acrylate, 2-hydroxyethyl(meth)acrylate, 2-hydroxypropyl(meth)acrylate, N,N-diethylaminoethyl (meth)acrylate, N,N-dimethylaminoethyl(meth)acrylate, dimethylaminoethyl (meth)acrylate, 2-methyl-2-adamantyl(meth)acrylate, 2-ethyl-2-adamantyl (meth)acrylate, 3-hydroxy-1-adamantyl(meth)acrylate, 1-adamantyl(meth)acrylate, isobornyl(meth)acrylate, 2-naphthyl(meth)acrylate, 2-hydroxy-3-phenoxypropyl (meth)acrylate, 2-(4-benzoyl-3-hydroxyphenoxy)ethyl(meth)acrylate, 9-anthracenyl (meth)acrylate, fluorescein o-(meth)acrylate, 2-(9H-carbazol-9-yl) ethyl(meth)acrylate, zirconium (meth)acrylate, β-carboxyethyl(meth)acrylate, octyl(meth)acrylate, decyl (meth)acrylate, (2-(tert-butylamino)ethyl(meth)acrylate, 1,2,2,6,6-pentamethyl-4-piperidyl(meth)acrylate, n-butyl(meth)acrylate, tert-butyl(meth)acrylate, 4-tert-butylcyclohexyl (meth)acrylate, o-phenylphenol glycidyl ether (meth)acrylate, hydroxyethylated o-phenylphenol (meth)acrylate, etc.

The compound (C) is preferably a (meth)acrylate having an aromatic ring (such as phenoxyethyl(meth)acrylate, 2-hydroxy-3-phenoxypropyl(meth)acrylate, phenoxyethylene glycol (meth)acrylate, phenoxydiethylene glycol (meth)acrylate, benzyl (meth)acrylate or 2-(meth)acryloyloxyethyl hexahydrophthalic acid), or a (meth)acrylate having an adamantane skeleton (such as 2-methyl-2-adamantyl(meth)acrylate, 2-ethyl-2-adamantyl(meth)acrylate, 3-hydroxy-1-adamantyl(meth)acrylate or 1-adamantyl (meth)acrylate), from the viewpoint of the compatibility.

As the compound (C), one type may be used alone, or two or more types may be used in combination.

The content of the compound (C) is from 5 to 35 mass %, preferably from 10 to 30 mass %, in the total (100 mass %) of the compound (A), the compound (B), the compound (C) and the photopolymerization initiator (D). When the content of the compound (C) is at least 5 mass %, the compatibility of the compound (A) with the compound (B) will be good. When the content of the compound (C) is at most 35 mass %, it is possible to obtain a cured product of the photocurable composition having a refractive index of at least 1.54 at a wavelength of 589 nm.

(Photopolymerization Initiator (D))

The photopolymerization initiator (D) may, for example, be an acetophenone photopolymerization initiator, a benzoin photopolymerization initiator, a benzophenone photopolymerization initiator, a thioxanthone photopolymerization initiator, an α-aminoketone photopolymerization initiator, an α-hydroxyketone photopolymerization initiator, an α-acyloxime ester, benzyl-(o-ethoxycarbonyl)-α-monooxime, acylphosphine oxide, glyoxyester, 3-ketocoumarin, 2-ethylanthraquinone, camphorquinone, tetramethylthiuram sulfide, azobisisobutyronitrile, benzoyl peroxide, a dialkyl peroxide or tert-butylperoxy pivalate. Among them, an acetophenone photopolymerization initiator, a benzoin photopolymerization initiator, an α-aminoketone photopolymerization initiator or a benzophenone photopolymerization initiator is preferred from the viewpoint of the sensitivity and compatibility.

As the acetophenone photopolymerization initiator, the following compounds may be mentioned.

Acetophenone, p-(tert-butyl) 1',1',1'-trichloroacetophenone, chloroacetophenone, 2',2'-diethoxyacetophenone, hydroxyacetophenone, 2,2-dimethoxy-2'-phenylacetophenone, 2-aminoacetophenone, a dialkylaminoacetophenone, etc.

As the benzoin photopolymerization initiator, the following compounds may be mentioned.

Benzyl, benzoin, benzoin methyl ether, benzoin ethyl ether, benzoin isopropyl ether, benzoin isobutyl ether, 1-hydroxycyclohexyl phenyl ketone, 2-hydroxy-2-methyl-1-phenyl-2-methylpropan-1-one, 1-(4-isopropylphenyl)-2-hydroxy-2-methylpropan-1-one, benzyl dimethyl ketal, etc.

As the α-aminoketone photopolymerization initiator, the following compounds may be mentioned.

2-Benzyl-2-dimethylamino-1-(4-morpholinophenyl)-butanone-1,2-methyl-1[4-(methylthio)phenyl]-2-morpholinopropan-1-one, etc.

As the benzophenone photopolymerization initiator, the following compounds may be mentioned.

Benzophenone, benzoyl benzoic acid, methyl benzoyl benzoate, methyl-o-benzoyl benzoate, 4-phenylbenzophenone, hydroxybenzophenone, hydroxypropylbenzophenone, acrylbenzophenone, 4,4'-bis(dimethylamino)benzophenone, etc.

As the photopolymerization initiator (D), one type may be used alone, or two or more types may be used in combination.

The content of the photopolymerization initiator (D) is from 1 to 12 mass %, preferably from 3 to 10 mass %, in the total (100 mass %) of the compound (A), the compound (B), the compound (C) and the photopolymerization initiator (D). When the content of the photopolymerization initiator (D) is at least 1 mass %, it is possible to easily obtain a cured product without carrying out an operation of e.g. heating. When the content of the photopolymerization initiator (D) is at most 12 mass %, mixing can be carried out uniformly, whereby the photopolymerization initiator (D) remaining in the cured product will be less, and deterioration of the physical properties of the cured product can be suppressed.

(Fluorinated Surfactant (E))

The photocurable composition may further contain a fluorinated surfactant (E) in addition to the compounds (A) to (C) and the photopolymerization initiator (D).

The fluorinated surfactant (E) is a component to improve the release property of the cured product.

As the fluorinated surfactant (E), a fluorinated surfactant having a fluorine content of from 10 to 70 mass %, is preferred, and a fluorinated surfactant having a fluorine content of from 10 to 40 mass %, is more preferred, in all elements (100 mass %) of the fluorinated surfactant (E). The fluorinated surfactant may be water-soluble or lipid soluble, preferably lipid soluble from the viewpoint of the compatibility of the photocurable composition and the dispersibility of the cured product.

The fluorinated surfactant (E) is preferably an anionic fluorinated surfactant, a cationic fluorinated surfactant, an amphoteric fluorinated surfactant or a nonionic fluorinated surfactant, and from the viewpoint of the compatibility of the photocurable composition and the dispersibility of the cured product, the nonionic fluorinated surfactant is more preferred.

The anionic fluorinated surfactant is preferably a polyfluoroalkylcarboxylic acid salt, a polyfluoroalkylphosphoric acid ester or a polyfluoroalkylsulfonic acid salt.

Specific examples of the anionic fluorinated surfactant include Surflon S-111 (tradename, manufactured by AGC Seimi Chemical Co., Ltd.), Fluorad FC-143 (tradename, manufactured by Sumitomo 3M Limited) and MEGAFACE F-120 (tradename, manufactured by DIC).

The cationic fluorinated surfactant is preferably a trimethylammonium salt of polyfluoroalkylcarboxylic acid, or a trimethylammonium salt of polyfluoroalkylsulfonic acid amide.

Specific examples of the cationic fluorinated surfactant include Surflon S-121 (tradename, manufactured by AGC Seimi Chemical Co., Ltd.), Fluorad FC-134 (tradename, manufactured by Sumitomo 3M Limited) and MEGAFACE F-150 (tradename, manufactured by DIC).

The amphoteric fluorinated surfactant is preferably a polyfluoroalkylbetain.

Specific examples of the amphoteric fluorinated surfactant include Surflon S-132 (tradename, manufactured by AGC Seimi Chemical Co., Ltd.), Fluorad FX-172 (tradename, manufactured by Sumitomo 3M Limited) and MEGAFACE F-120 (tradename, manufactured by DIC).

The nonionic fluorinated surfactant is preferably a polyfluoroalkylamine oxide or a polyfluoroalky.alkylene oxide adduct.

Specific examples of the nonionic fluorinated surfactant include Surflon S-145 (tradename, manufactured by AGC Seimi Chemical Co., Ltd.), Surflon S-393 (tradename, manufactured by AGC Seimi Chemical Co., Ltd.), Surflon KH-20 (tradename, manufactured by AGC Seimi Chemical Co., Ltd.), Surflon KH-40 (tradename, manufactured by AGC Seimi Chemical Co., Ltd.), Fluorad FC-170 (tradename, manufactured by Sumitomo 3M Limited), Fluorad FC-430 (tradename, manufactured by Sumitomo 3M Limited), and MEGAFACE F-141 (tradename, manufactured by DIC).

As the fluorinated surfactant (E), one type may be used alone, or two or more types may be used in combination.

The content of the fluorinated surfactant (E) is preferably from 0.01 to 3 parts by mass, more preferably from 0.1 to 1 part by mass, per 100 parts by mass of the total of the compound (A), the compound (B), the compound (C) and the photopolymerization initiator (D). When the content of the fluorinated surfactant (E) is at least 0.01 part by mass, the release property will be improved. When the content of the fluorinated surfactant (E) is at most 3 parts by mass, the hindrance in curing of the photocurable composition can be suppressed, and phase separation of the cured product can be suppressed.

(Additives (F))

The photocurable composition may contain other additives (F) other than the compounds A) to (C), the photopolymerization initiator (D) and the fluorinated surfactant (E).

The additives (F) may, for example, be a compound having a carbon-carbon unsaturated double bond (provided that the compounds (A) to (C) are excluded), a photosensitizer, a polymer, metal oxide fine particles, a carbon compound, metal fine particles and other organic compounds.

The photosensitizer may, for example, be n-butylamine, di-n-butylamine, tri-n-butylphosphine, allylthiourea, s-benzyl isothiuronium-p-toluene sulfinate, or an amine compound such as triethylamine, diethylaminoethyl methacrylate, triethylene tetramine or 4,4'-bis(dialkylamino)benzophenone.

The polymer may, for example, be a fluorinated polymer, a polystyrene, a polythiophene, a polyester oligomer, a polycarbonate or a poly(meth)acrylate.

The metal oxide fine particles may, for example, be titania, silica-coated titania, zirconia, zinc oxide, silica, alumina or iron oxide.

The carbon compound may, for example, be carbon nanotube, fullerene, diamond or DLC.

The metal fine particles may, for example, be copper or platinum.

Other organic compounds may, for example, be porphyrin or metal-encapsulated porphyrin.

The total amount of the additives (F) is preferably at most 20 mass % in the photocurable composition (100 mass %). When the total amount of the additives (F) is at most 20 mass %, they can be uniformly mixed in the photocurable composition, whereby a homogeneous photocurable composition can be obtained.

By the photocurable composition of the present invention as described above, it is possible to obtain a cured product of the photocurable composition having a refractive index of at least 1.54 at a wavelength of 589 nm, as it contains the compound (A). Further, as it contains the compound (B), it is possible to obtain a cured product excellent in the release property.

Further, as it contains the compound (C), it is excellent in the compatibility of the compound (A) with the compound (B), and as a result, the release property and mechanical strength of the cured product will be further improved.

<Process for Producing Molded Product Having Fine Pattern on its Surface>

The process for producing a molded product having a fine pattern on its surface according to the present invention, comprises the following steps (1) to (3):

(1) a step of bringing the photocurable composition of the present invention in contact with a surface of a mold, having a reverse pattern of said fine pattern, (2) a step of irradiating the photocurable composition with light in such a state that the photocurable composition is in contact with the surface of the mold, to cure the photocurable composition to form a cured product, and (3) a step of separating the mold from the cured product to obtain a molded product having a fine pattern on its surface.

More specifically, the following processes (a) to (c) may be mentioned as the process for producing a molded product having a fine pattern on its surface according to the present invention.

Process (a):

A process comprising the following steps (a-1) to (a-4):

(a-1) a step of placing the photocurable composition 20 on a surface of a substrate 30, as shown in FIG. 1, (a-2) a step of pressing a mold 10 against the photocurable composition 20 so that the reverse pattern 12 of the mold 10 is in contact with the photocurable composition 20, as shown in FIG. 1, (a-3) a step of irradiating the photocurable composition 20 with light in such a state that the mold 10 is pressed against the photocurable composition 20, to cure the photocurable composition 20 to form a cured product, and (a-4) a step of separating the mold 10, or the substrate 30 and the mold 10, from the cured product to obtain a molded product having a fine pattern on its surface.

Figure 2:
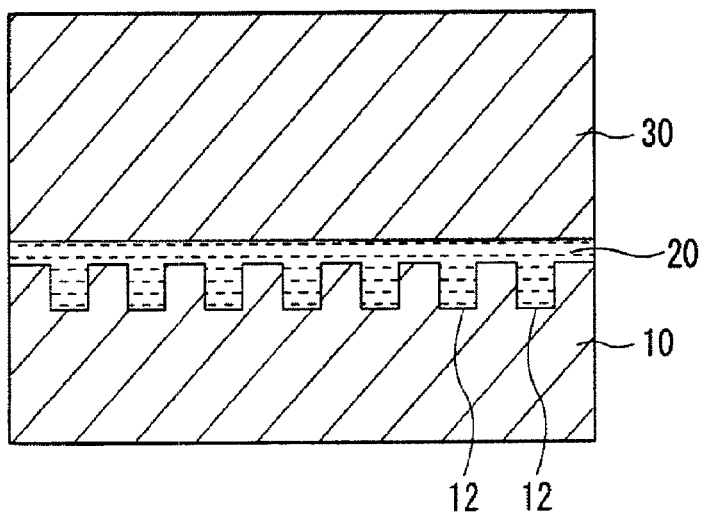
FIG. 2 is a cross-sectional view illustrating another embodiment of the process for producing a molded product having a fine pattern on its surface.

Process (b):

A process comprising the following steps (b-1) to (b-4):

(b-1) a step of placing the photocurable composition 20 on a surface of the mold 10, having the reverse pattern 12, as shown in FIG. 2, (b-2) a step of pressing a substrate 30 against the photocurable composition 20 on the surface of the mold 10, as shown in FIG. 2, (b-3) a step of irradiating the photocurable composition 20 with light in such a state that the substrate 30 is pressed against the photocurable composition 20, to cure the photocurable composition 20 to form a cured product, and (b-4) a step of separating the mold 10, or the substrate 30 and the mold 10, from the cured product to obtain a molded product having a fine pattern on its surface.

Process (c):

A process comprising the following steps (c-1) to (c-4):

(c-1) a step of bringing a substrate 30 and a mold 10 to be close to or in contact with each other, so that the reverse pattern 12 of the mold 10 is on the substrate 30 side, as shown in FIG. 1, (c-2) a step of filing the photocurable composition 20 between the substrate 30 and the mold 10, as shown in FIG. 1, (c-3) a step of irradiating the photocurable composition 20 with light in such a state that the substrate 30 and the mold 20 are close to or in contact with each other, to cure the photocurable composition 20 to form a cured product, and (c-4) a step of separating the mold 10, or the substrate 30 and the mold 10, from the cured product to obtain a molded product having a fine pattern on its surface.

The substrate may, for example, be a substrate made of an inorganic material or a substrate made of an organic material.

As the substrate made of an inorganic material, a silicon wafer, glass, quartz glass, a metal (such as aluminum, nickel or copper), a metal oxide (such as alumina), silicon nitride, aluminum nitride or lithium niobate, may, for example, be mentioned.

As the substrate made of an organic material, a fluororesin, a silicone resin, an acrylic resin, a polycarbonate, a polyester (such as polyethylene terephthalate), a polyimide, a polypropylene, a polyethylene, a nylon resin, a polyphenylene sulfide or a cyclic polyolefin may, for example, be mentioned.

As the substrate, a surface-treated substrate may be employed, since it is excellent in the adhesion with the photocurable composition. The surface treatment may, for example, be primer-coating treatment, ozone treatment or plasma etching treatment. As the primer to be used for primer coating treatment, a silane coupling agent or silazane may, for example, be mentioned.

The mold may be a mold made of a non-light transmitting material or a mold made of a light-transmitting material.

As the light-non-transmitting material for the mold, a silicon wafer, nickel, copper, stainless steel, titanium, SiC or mica may, for example, be mentioned.

As the light-transmitting material for the mold, quartz, glass, a polydimethylsiloxane, a cyclic polyolefin, a polycarbonate, a polyethylene terephthalate or a transparent fluororesin may, for example, be mentioned.

At least one of the substrate and the mold is made of a material which transmits at least 40% of light having a wavelength with which the photopolymerization initiator (D) is reactive.

The mold has a reverse pattern on its surface. The reverse pattern is a reverse pattern corresponding to the fine pattern on the surface of the molded product.

The reverse pattern has fine convexes and/or concaves.

The convexes may, for example, be long convex lines extending on the surface of the mold or protrusions dotted on the surface.

The concaves may, for example, be long grooves extending on the surface of the mold or holes dotted on the surface.

The shape of the convex lines or grooves may, for example, be linear, curved or bent. The convex lines or grooves may be a plurality of stripes extending in parallel with one another.

The cross-sectional shape of the convex lines or grooves in a direction perpendicular to the longitudinal direction may, for example, be rectangular, trapezoidal, triangular or semicircular.

The shape of the protrusions or holes may, for example, be triangular prism, quadrangular prism, hexagonal column, cylindrical column, triangular pyramid, quadrangular pyramid, hexagonal pyramid, circular cone, hemispherical or polyhedral.

The width of convex lines or grooves is preferably from 50 nm to 500 µm, more preferably from 70 nm to 300 µm, on average. The width of the convex lines means the length of the bottom in the cross section in a direction perpendicular to the longitudinal direction. The width of the grooves means the length of the upper side in the cross section in a direction perpendicular to the longitudinal direction.

The width of the protrusions or holes is preferably from 50 nm to 500 µm, more preferably from 70 nm to 300 µm, on average. The width of the protrusions means the length of the bottom in the cross section in a direction perpendicular to the longitudinal direction, in a case where the bottom side is elongated, or otherwise means the maximum length at the bottom surface of the protrusions. The width of the holes means the length of the upper side in the cross section in the direction perpendicular to the longitudinal direction, when the opening is elongated, or otherwise, means the maximum length at the openings of the holes.

The height of the convexes is preferably from 50 nm to 500 µm, more preferably from 70 nm to 300 µm, on average.

The depth of the concaves is preferably from 50 nm to 500 µm, more preferably from 70 nm to 300 µm, on average.

In an area where the reverse pattern is dense, the distance between the adjacent convexes (or concaves) is preferably from 50 nm to 500 µm, more preferably from 70 nm to 300 µm, on average. The distance between the adjacent convexes means the distance from the terminal edge of the bottom in the cross section of a convex to the starting edge of the bottom in the cross section of the adjacent convex. The distance between the adjacent concaves means the distance from the terminal edge of the upper side in the cross section of a concave to the starting edge of the upper side in the cross section of the adjacent concave.

The minimum dimension of a convex is preferably from 50 nm to 500 µm, more preferably from 70 nm to 300 µm, particularly preferably from 70 nm to 150 µm. The minimum dimension of a convex means the minimum dimension among the width, length and height of the convex.

The minimum dimension of a concave is preferably from 50 nm to 500 µm, more preferably from 70 nm to 300 µm, particularly preferably from 70 nm to 150 µm. The minimum dimension of a concave means the minimum dimension among the width, length and depth of the concave.

Step (a-1):

The method for placing the photocurable composition may, for example, be an ink jetting method, a potting method, a spin coating method, a roll coating method, a casting method, a dip coating method, a die coating method, a Langmuir-Blodgett method or a vacuum vapor deposition method.

The photocurable composition may be placed over the entire surface of the substrate or on a part of the surface of the substrate.

Step (a-2):

The pressing pressure (gauge pressure) at the time of pressing the mold against the photocurable composition is preferably more than 0 and not more than 10 MPa, more preferably from 0.1 MPa to 5 MPa. The temperature at the time of pressing the mold against the photocurable composition is preferably from 0 to 100° C., more preferably from 10 to 60° C.

Step (b-1):

The method for placing the photocurable composition may, for example, be an ink jetting method, a potting method, a spin coating method, a roll coating method, a casting method, a dip coating method, a die coating method, a Langmuir-Blodgett method or a vacuum vapor deposition method.

The photocurable composition may be placed over the entire surface of the reverse pattern of the mold, or on a part of the reverse pattern, and it is preferably placed over the entire surface of the reverse pattern.

Step (b-2):

The pressing pressure (gauge pressure) at the time of pressing the substrate against the photocurable composition is preferably more than 0 and not more than 10 MPa, more preferably from 0.1 MPa to 5 MPa. The temperature at the time of pressing the substrate against the photocurable composition is preferably from 0 to 100° C., more preferably from 10 to 60° C.

Step (c-2):

The method for filing the photocurable composition between the substrate and the mold may, for example, be a method of aspirating the photocurable composition into the space by a capillary phenomenon.

The temperature at the time of filling the photocurable composition is preferably from 0 to 100° C., more preferably from 10 to 60° C. STEPS (a-3), (b-3) and (c-3):

The method for irradiation with light may, for example, be a method wherein using a mold made of light-transmitting material, light is applied from the mold side, or using a substrate made of a light-transmitting material, light is applied from the substrate side. The wavelength of the light is preferably from 200 to 500 nm, more preferably from 250 to 400 nm. At the time of irradiation with light, the photocurable composition may be heated to accelerate the curing.

The temperature at the time of irradiation with light is preferably from 0 to 100° C., more preferably from 10 to 60° C.

Steps (a-4), (b-4) and (c-4):

The temperature at the time of separating the mold, or the substrate and the mold, from the cured product, is preferably from 0 to 100° C., more preferably from 10 to 60° C.

Figure 3:
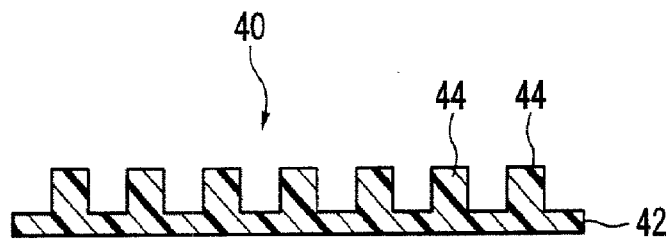
FIG. 3 is a cross-sectional view illustrating an embodiment of the molded product having a fine pattern on its surface.

In a case where the substrate and the mold are separated from the cured product, a molded product 40 having a fine pattern 44 on its surface is obtainable, which is composed solely of a cured product 42 having a surface on which a reverse pattern of the mold is transferred, as shown in FIG. 3.

Figure 4:
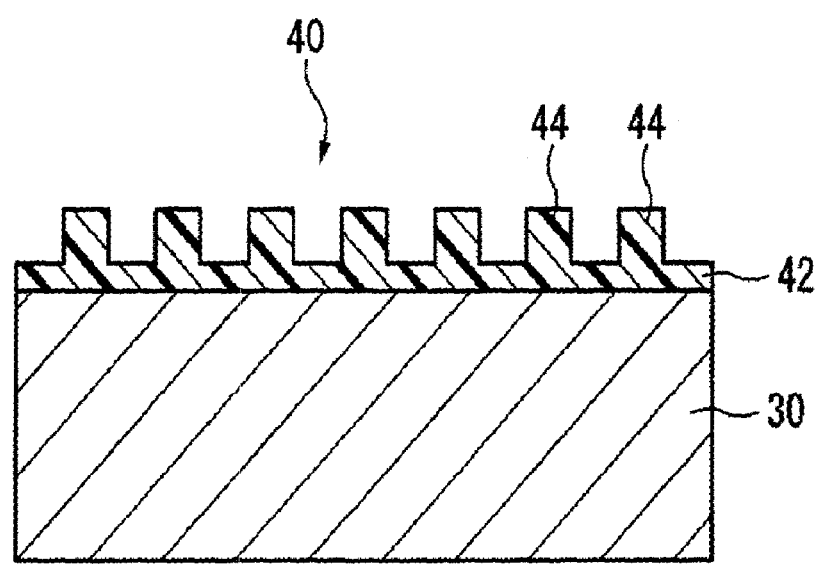
FIG. 4 is a cross-sectional view illustrating another embodiment of the molded product having a fine pattern on its surface.

In a case where only the mold is separated from the cured product, a molded product 40 (laminate) having a fine pattern 44 on its surface is obtainable, which comprises the substrate 30 and the cured product 42 having a surface on which a reverse pattern of the mold is transferred, as shown in FIG. 4.

As the molded product having a fine pattern on its surface, the following articles may be mentioned.

Optical elements: a microlens array, an optical waveguide, an optical switching element (such as a grid polarizing element or a wavelength plate) a Fresnel zone plate element, a binary element, a braze element, a photonic crystal, etc.

Antireflection components: An AR (anti reflection) coating component, etc.

Chips: A biochip, a chip for μ-TAS (micro-total analysis systems), a microreactor chip, etc.

Others: Recording media, a display material, a carrier for a catalyst, a filter, a sensor component, a resist which will be used for the preparation of semiconductor devices, or a daughter mold for nanoimprinting, etc.

When used as a resist, a fine pattern can be formed on a substrate by etching the substrate by using the molded product having the fine pattern as a mask.

By the above process for producing a molded product having a fine pattern on its surface according to the present invention, since the photocurable composition of the present invention whereby a cured product provided with both the release property and the high refractive index, can be obtained, is used, it is possible to produce a molded product having a high refractive index and having on its surface a fine pattern having a reverse pattern of the mold precisely transferred.

EXAMPLES

Now, the present invention will be described in further detail with reference to Examples, but it should be understood that the present invention is by no means restricted to such Examples.

EXAMPLES 1 to 6, 15 and 16 are Working Examples of the present invention, and Examples 7 to 14 are Comparative Examples.

(Refractive Index)

The refractive index of the photocurable composition was obtained as follows.

The photocurable composition was irradiated for 15 seconds with light from a high pressure mercury lamp (a light source having main wavelengths at 254 nm, 315 nm and 365 nm at from 1.5 to 2.0 kHz) to obtain a cured product.

With respect to the cured product, the refractive index at a wavelength of 589 nm was measured at 23° C. by means of an Abbe refractometer (2T model, manufactured by ATAGO).

(Sensitivity)

The Sensitivity of the Photocurable Composition was Obtained as Follows.

The photocurable composition was applied by a spin coating method to form a coating film having a thickness of about 1.5 μm, which was irradiated with light from a high pressure mercury lamp (a light source having main wavelengths at 254 nm, 315 nm and 365 nm at from 1.5 to 2.0 kHz), whereby the integrated quantity of light until the composition was completely cured, was obtained and taken as the sensitivity.

Whether or not the photocurable composition was completely cured, was judged by measuring the IR spectrum to see the presence or absence of an absorption of an olefin of the acrylic portion. When the integrated quantity of light was at most 1,000 mJ/cm², the sensitivity was judged to be good.

(Viscosity)

The viscosity at 25° C. of the photocurable composition was measured by using a viscometer (TV-20, manufactured by TOKI SANGYO CO., LTD.) already corrected by a standard liquid (JS50 (33.17 mPa·s at 25° C.).

(Contact Angle)

The contact angle of the cured product to water was measured as follows. The photocurable composition was irradiated for 15 seconds with light from a high pressure mercury lamp (a light source having main wavelengths of 254 nm, 315 nm and 365 nm at from 1.5 to 2.5 kHz) to obtain a cured product.

With respect to the cured product, the contact angle was measured by using a contact angle meter (CA-X150 model, manufactured by Kyowa Interface Science Co., Ltd.) by dropping 4 μL of water on the surface of the cured product in accordance with JIS R3257.

The contact angle to water is an index for the release property of the cured product. When the contact angle was at least 75°, the release property was judged to be good.

(Compound (A))

Compound (A71): Manufactured by Osaka Gas Chemical Co., Ltd., tradename: OGSOL EA-F5003, 9,9-bis(4-hydroxyphenyl)fluorene ethylene oxide-modified diacrylate, refractive index at a wavelength of 589 nm: 1.583.

(Compound (B))

Compound (B11): Manufactured by Aldrich, 3,3,4,4,5,5,6,6,7,7,8,8,8-tridecafluorooctyl acrylate.

Compound (B21): 1,1,2,3,3,-Pantafluoro-4-trifluoromethyl-4-hydroxy-1,6-heptadiene.

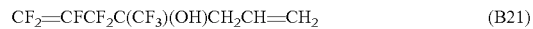

Preparation Examples

Preparation of compound (B21):

Into a 2 L glass reactor, 108 g of CF$_2$ClFClCF$_2$C(O)CF$_3$ and 500 mL of dehydrated tetrahydrofuran were put and cooled to 0° C. In a nitrogen atmosphere, one having 200 mL of a 2M tetrahydrofuran solution of CH$_2$=CHCH$_2$MgCl further diluted with 200 mL of dehydrated tetrahydrofuran, was dropwise added thereto over a period of about 5.5 hours. After completion of the dropwise addition, stirring was carried out at 0° C. for 30 minutes and at room temperature for 17 hours, and then, 200 mL of 2N hydrochloric acid was dropwise added. Further, 200 mL of water and 300 mL of diethyl ether were added, followed by liquid separation to obtain a diethyl ether layer as an organic layer. The organic layer was dried over magnesium sulfate, followed by filtration to obtain a crude liquid. The crude liquid was concentrated by an evaporator and then subjected to distillation under reduced pressure to obtain 85 g of CF$_2$ClCFClCF$_2$C(CF$_3$)(OH)CH$_2$CH=CH$_2$ (distillation temperature: 60-66° C./0.7 kPa).

Then, into a 500 mL glass reactor, 81 g of zinc and 170 mL of dioxane were put, and activation of zinc was carried by iodine. Then, after heating to 100° C., one having 84 g of the above CF$_2$ClCFClCF$_2$C(CF$_3$)(OH)CH$_2$CH=CH$_2$ diluted with 50 mL of dioxane, was dropwise added over a period of 1.5 hours. After completion of the dropwise addition, stirring was carried out at 100° C. for 40 hours. The reaction liquid was filtered and washed with a small amount of dioxane. The filtrate was distilled under reduced pressure to obtain 30 g of CF$_2$=CFCF$_2$C(CF$_3$)(OH)CH$_2$CH=CH$_2$ (distillation temperature: 36-37° C./1 kPa). The $^1$H-NMR and $^{19}$F-NMR data are shown below.

$^1$H-NMR (399.8 MHz, solvent: CDCl$_3$, standard: tetramethylsilane) δ (ppm): 2.74 (d, J=7.3, 2H), 3.54 (boad s, 1H), 5.34 (m, 2H), 5.86 (m, 1H).

$^{19}$F-NMR (376.2 MHz, solvent: CDCl$_3$, standard: CFCl$_3$) δ (ppm): −75.7 (m, 3F), −92.2 (m, 1F), −106.57 (m, 1F), −112.6 (m, 2F), −183.5 (m, 1F).

(Compound (C))

Compound (C1): Manufactured by Idemitsu Kosan Co., Ltd. 2-methyl-2-adamantyl methacrylate

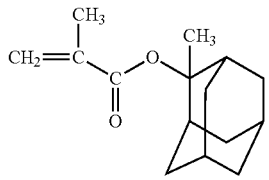

Compound (C2): Aldrich, benzyl methacrylate

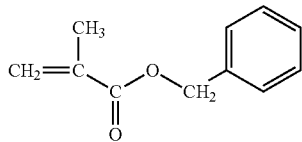

(Photopolymerization Initiator (D))

Photopolymerization initiator (D1): Manufactured by Ciba Geigy Specialty, tradename: IRGACURE 651.

(Fluorinated Surfactant (E))

Fluorinated surfactant (E1): Non-ionic fluorinated surfactant, manufactured by AGC Seimi Chemical Co., Ltd., tradename: Surflon S-393.

(Additives (F))

Additive (F1): Titanium oxide (nanopowder, manufactured by Aldrich).

Additive (F2): Zirconia oxide (nanopowder, manufactured by Aldrich).

Example 1

To a vial container (inner volume: 6 mL), 2.60 g of the compound (A71), 0.20 g of the compound (B11) and 1.04 g of the compound (C1) were added, and then, 0.16 g of the photopolymerization initiator (D1) was mixed thereto, followed by filtration by a filter made of polytetrafluoroethylene (hereinafter referred to as PTFE) of 5.0 μm, to obtain a photocurable composition. The composition of this composition is shown in Table 1, and the evaluation results are shown in Table 2.

Example 2

To a vial container (inner volume: 6 mL), 2.60 g of the compound (A71), 0.20 g of the compound (B11) and 1.04 g of the compound (C2) were added, and then, 0.16 g of the photopolymerization initiator (D1) was mixed thereto, followed by filtration by a filter made of PTFE of 5.0 μm, to obtain a photocurable composition. The composition of this composition is shown in Table 1, and the evaluation results are shown in Table 2.

Example 3

To a vial container (inner volume: 6 mL), 3.00 g of the compound (A71), 0.28 g of the compound (B11) and 0.60 g of the compound (C1) were added, and then, 0.12 g of the photopolymerization initiator (D1) was mixed thereto, followed by filtration by a filter made of PTFE of 5.0 μm, to obtain a photocurable composition. The composition of this composition is shown in Table 1, and the evaluation results are shown in Table 2.

Example 4

To a vial container (inner volume: 6 mL), 2.60 g of the compound (A71), 0.20 g of the compound (B11) and 1.04 g of the compound (C1) were added, and then, 0.16 g of the photopolymerization initiator (D1) and 0.004 g of the fluorinated surfactant (E1) were mixed thereto, followed by filtration by a filter made of PTFE of 5.0 μm, to obtain a photocurable composition. The composition of this composition is shown in Table 1, and the evaluation results are shown in Table 2.

Example 5

To a vial container (inner volume: 6 mL), 2.60 g of the compound (A71), 0.20 g of the compound (B11) and 1.04 g of the compound (C1) were added, and then, 0.16 g of the photopolymerization initiator (D1) and 0.12 g of the additive (F1) were mixed thereto, followed by mixing by a high speed stirrer and then by filtration by a filter made of PTFE of 5.0 μm, to obtain a photocurable composition. The composition of this composition is shown in Table 1, and the evaluation results are shown in Table 2.

Example 6

To a vial container (inner volume: 6 mL), 2.60 g of the compound (A71), 0.20 g of the compound (B11) and 1.04 g of the compound (C1) were added, and then, 0.16 g of the photopolymerization initiator (D1) and 0.12 g of the additive (F2) were added, followed by mixing by a high speed stirrer and then by filtration by a filter made of PTFE of 5.0 μm, to obtain a photocurable composition. The composition of this composition is shown in Table 1, and the evaluation results are shown in Table 2.

Example 7

To a vial container (inner volume: 6 mL), 2.20 g of the compound (A71), 0.40 g of the compound (B11) and 1.24 g of the compound (C1) were added, and then, 0.16 g of the photopolymerization initiator (D1) was mixed thereto, followed by filtration by a filter made of PTFE of 5.0 μm, to obtain a photocurable composition. The composition of this composition is shown in Table 1, and the evaluation results are shown in Table 2.

Example 8

To a vial container (inner volume: 6 mL), 3.68 g of the compound (A71), 0.08 g of the compound (B11) and 0.20 g of the compound (C1) were added, and then, 0.04 g of the photopolymerization initiator (D1) was mixed thereto. However, phase separation took place, and it was not possible to obtain a uniform composition.

Example 9

To a vial container (inner volume: 6 mL), 2.60 g of the compound (A71), 0.04 g of the compound (B11) and 1.20 g of the compound (C1) were added, and then, 0.16 g of the photopolymerization initiator (D1) was mixed thereto, followed by filtration by a filter made of PTFE of 5.0 μm, to obtain a photocurable composition. The composition of this composition is shown in Table 1, and the evaluation results are shown in Table 2.

Example 10

To a vial container (inner volume: 6 mL), 2.60 g of the compound (A71), 0.80 g of the compound (B11) and 0.44 g of the compound (C1) were added, and then, 0.16 g of the photopolymerization initiator (D1) was mixed thereto. However, phase separation took place, and it was not possible to obtain a uniform composition.

Example 11

To a vial container (inner volume: 6 mL), 3.40 g of the compound (A71), 0.32 g of the compound (B11) and 0.08 g of the compound (C1) were added, and then, 0.20 g of the photopolymerization initiator (D1) was mixed thereto. However, phase separation took place, and it was not possible to obtain a uniform composition.

Example 12

To a vial container (inner volume: 6 mL), 2.44 g of the compound (A71), 0.08 g of the compound (B11) and 1.44 g of the compound (C1) were added, and then, 0.04 g of the photopolymerization initiator (D1) was mixed thereto, followed by filtration by a filter made of PTFE of 5.0 μm, to obtain a photocurable composition. The composition of this composition is shown in Table 1, and the evaluation results are shown in Table 2.

Example 13

To a vial container (inner volume: 6 mL), 2.60 g of the compound (A71), 0.20 g of the compound (B11) and 1.18 g of the compound (C1) were added, and then, 0.02 g of the photopolymerization initiator (D1) was mixed thereto, followed by filtration by a filter made of PTFE of 5.0 μm, to obtain a photocurable composition. The composition of this composition is shown in Table 1, and the evaluation results are shown in Table 2.

Example 14

To a vial container (inner volume: 6 mL), 2.52 g of the compound (A71), 0.20 g of the compound (B11) and 0.68 g of the compound (C1) were added, and then, 0.60 g of the photopolymerization initiator (D1) was mixed thereto. However, the photopolymerization initiator (D1) was not completely dissolved, and it was not possible to obtain a uniform composition.

Example 15

To a vial container (inner volume: 6 mL), 2.60 g of the compound (A71), 0.20 g of the compound (B21) and 1.04 g of the compound (C1) were added, and then, 0.16 g of the photopolymerization initiator (D1) was mixed thereto, followed by filtration by a filter made of PTFE of 5.0 μm, to obtain a photocurable composition. The composition of this composition is shown in Table 1, and the evaluation results are shown in Table 2.

The symbol "-" in Table 1 means that the fluorinated surfactant (E) and/or the additive (F) was not used, and the symbol "-" in Table 2 means that evaluation of the respective physical properties was not carried out or could not be carried out.

TABLE 1

| | Mass % in 100 mass % of (A) + (B) + (C) + (D) | | | | Parts by mass per 100 parts by mass of (A) + (B) + (C) + (D) | |
|---|---|---|---|---|---|---|
| | (A) | (B) | (C) | (D) | (E) | (F) |
| Example 1 | 65.0 | 5.0 | 26.0 | 4.0 | — | — |
| Example 2 | 65.0 | 5.0 | 26.0 | 4.0 | — | — |
| Example 3 | 75.0 | 7.0 | 15.0 | 3.0 | — | — |
| Example 4 | 65.0 | 5.0 | 26.0 | 4.0 | 0.1 | — |
| Example 5 | 65.0 | 5.0 | 26.0 | 4.0 | — | 3 |
| Example 6 | 65.0 | 5.0 | 26.0 | 4.0 | — | 3 |
| Example 7 | 55.0 | 10.0 | 31.0 | 4.0 | — | — |
| Example 8 | 92.0 | 2.0 | 5.0 | 1.0 | — | — |
| Example 9 | 65.0 | 1.0 | 30.0 | 4.0 | — | — |
| Example 10 | 65.0 | 20.0 | 11.0 | 4.0 | — | — |
| Example 11 | 85.0 | 8.0 | 2.0 | 5.0 | — | — |
| Example 12 | 61.0 | 2.0 | 36.0 | 1.0 | — | — |
| Example 13 | 65.0 | 5.0 | 29.5 | 0.5 | — | — |
| Example 14 | 63.0 | 5.0 | 17.0 | 15.0 | — | — |
| Example 15 | 65.0 | 5.0 | 26.0 | 4.0 | — | — |

TABLE 2

| | Refractive index | Sensitivity (mJ/cm$^2$) | Viscosity (mPa·s) | Contact angle (degree) |
|---|---|---|---|---|
| Example 1 | 1.57 | 441 | 423 | 81 |
| Example 2 | 1.58 | 662 | 317 | 80 |
| Example 3 | 1.58 | 662 | 856 | 81 |
| Example 4 | 1.57 | 441 | 423 | 93 |
| Example 5 | 1.60 | 441 | 455 | 77 |
| Example 6 | 1.59 | 441 | 457 | 79 |
| Example 7 | 1.53 | 441 | 287 | 79 |
| Example 8 | — | — | — | — |
| Example 9 | 1.58 | 441 | 431 | 70 |
| Example 10 | — | — | — | — |
| Example 11 | — | — | — | — |
| Example 12 | 1.53 | 945 | 363 | 79 |
| Example 13 | 1.57 | 7560 | 378 | 81 |
| Example 14 | — | — | — | — |
| Example 15 | 1.57 | 662 | 447 | 77 |

Example 16

One droplet of the photocurable composition in Example 1 was dropped on a silicon wafer at 25° C. to obtain a silicon wafer coated uniformly with the composition. A quartz mold having on its surface concaves with a width of 800 nm, a depth of 180 nm and a length of 10 μm, was pressed against the photocurable composition on the silicon wafer, followed by pressing under 0.5 MPa (gauge pressure) as it was.

Then at 25° C., the photocurable composition was irradiated for 15 seconds with light from a high pressure mercury lamp (a light source having main wavelengths of 254 nm, 315 nm and 365 nm at from 1.5 to 2.0 kHz) from the mold side, to obtain a cured product of the photocurable composition. At 25° C., the mold was separated from the silicon wafer to obtain a molded product having, formed on the surface of the silicon wafer, a cured product having on its surface convexes having the concaves of the mold inverted. The heights of the convexes from the bottom to the top were from 178 to 180 nm.

INDUSTRIAL APPLICABILITY

The molded product having a fine pattern on its surface, obtainable by the process of the present invention, is useful as an optical element such as a microlens array, an optical waveguide element, an optical switching element (such as a grid polarizing element or a wavelength plate), a Fresnel zone plate element, a binary element, a Blaise element or a Photonic crystal, as an antireflection component, or as a replica mold for production.

The entire disclosure of Japanese Patent Application No. 2008-140764 filed on May 29, 2008 including specification, claims, drawings and summary is incorporated herein by reference in its entirety.

DESCRIPTION OF SYMBOLS

10: mold
12: reverse pattern
20: photocurable composition
30: substrate
40: molded product
42: cured product
44: fine pattern

What is claimed is:

1. A photocurable composition comprising:
    a compound (A) having a refractive index of at least 1.55 at a wavelength of 589 nm before curing and having at least two (meth)acryloyloxy groups,
    a compound (B) having fluorine atoms and at least one carbon-carbon unsaturated double bond (provided that the compound (A) is excluded),
    a compound (C) having one (meth)acryloyloxy group (provided that the compound (B) is excluded), and
    a photopolymerization initiator (D),
    wherein in the total (100 mass %) of the compound (A), the compound (B), the compound (C) and the photopolymerization initiator (D), the compound (A) is from 61 to 90 mass %, the compound (B) is from 2 to 15 mass %, the compound (C) is from 5 to 35 mass %, and the photopolymerization initiator (D) is from 1 to 12 mass %,
    wherein the compound (A) has at least two (meth)acryloyl groups and at least two benzene groups in the form of a condensed ring.

2. The photocurable composition according to claim 1, which further contains a fluorinated surfactant (E).

3. The photocurable composition according to claim 1, which contains substantially no solvent.

4. The photocurable composition according to claim 1, which has a refractive index of at least 1.54 at a wavelength of 589 nm after curing.

5. A process for producing a molded product having a fine pattern on its surface, which comprises:
    a step of bringing the photocurable composition as defined in claim 1 in contact with a surface of a mold, having a reverse pattern of said fine pattern,
    a step of irradiating the photocurable composition with light in such a state that the photocurable composition is in contact with the surface of the mold, to cure the photocurable composition to form a cured product, and
    a step of separating the mold from the cured product to obtain a molded product having a fine pattern on its surface.

6. A process for producing a molded product having a fine pattern on its surface, which comprises:
    a step of placing the photocurable composition as defined in claim 1 on a surface of a substrate,
    a step of pressing a mold having a reverse pattern of said fine pattern on its surface against the photocurable composition so that the reverse pattern of the mold is in contact with the photocurable composition,
    a step of irradiating the photocurable composition with light in such a state that the mold is pressed against the photocurable composition, to cure the photocurable composition to form a cured product, and
    a step of separating the mold, or the mold and the substrate, from the cured product to obtain a molded product having a fine pattern on its surface.

7. A process for producing a molded product having a fine pattern on its surface, which comprises:
    a step of placing the photocurable composition as defined in claim 1 on a surface of a mold, having a reverse pattern of said fine pattern,
    a step of pressing a substrate against the photocurable composition,
    a step of irradiating the photocurable composition with light in such a state that the substrate is pressed against the photocurable composition, to cure the photocurable composition to form a cured product, and
    a step of separating the mold, or the substrate and the mold, from the cured product to obtain a molded product having a fine pattern on its surface.

8. A process for producing a molded product having a fine pattern on its surface, which comprises:
    a step of bringing a substrate and a mold having a reverse pattern of said fine pattern on its surface to be close to or in contact with each other, so that the reverse pattern of the mold is on the substrate side,
    a step of filing the photocurable composition as defined in claim 1 between the substrate and the mold,
    a step of irradiating the photocurable composition with light in such a state that the substrate and the mold are close to or in contact with each other, to cure the photocurable composition to form a cured product, and
    a step of separating the mold, or the substrate and the mold, from the cured product to obtain a molded product having a fine pattern on its surface.

9. The process for producing a molded product having a fine pattern on its surface according to claim 5, wherein the light used for curing the photocurable composition has a wavelength of from 200 to 500 nm.

10. The process for producing a molded product having a fine pattern on its surface according to claim 6, wherein the light used for curing the photocurable composition has a wavelength of from 200 to 500 nm.

11. The process for producing a molded product having a fine pattern on its surface according to claim 7, wherein the light used for curing the photocurable composition has a wavelength of from 200 to 500 nm.

12. The process for producing a molded product having a fine pattern on its surface according to claim 8, wherein the light used for curing the photocurable composition has a wavelength of from 200 to 500 nm.

13. A molded product obtained by the process for producing a molded product having a fine pattern on its surface as defined in claim 5.

14. A molded product obtained by the process for producing a molded product having a fine pattern on its surface as defined in claim 6.

15. A molded product obtained by the process for producing a molded product having a fine pattern on its surface as defined in claim 7.

16. A molded product obtained by the process for producing a molded product having a fine pattern on its surface as defined in claim 8.

17. The photocurable composition according to claim 1, wherein the compound (A) includes at least one group selected from the group consisting of a naphthalene ring, an anthracene ring and a fluorene ring.

18. The photocurable composition according to claim 1, wherein the compound (A) includes a fluorenyl group.

19. The photocurable composition according to claim 1, wherein the compound (A) is of formula (A3)-(A7):

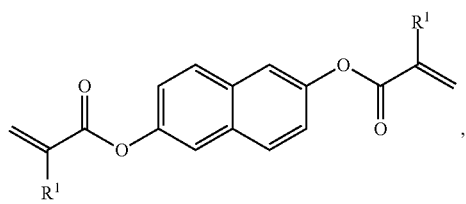
(A3)

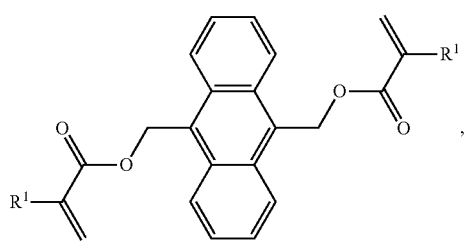
(A4)

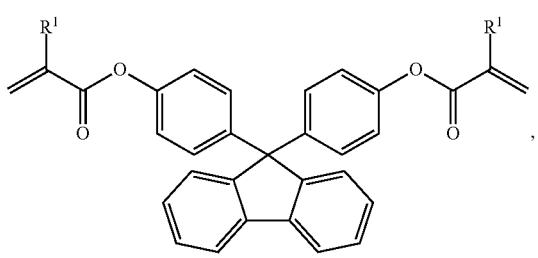
(A5)

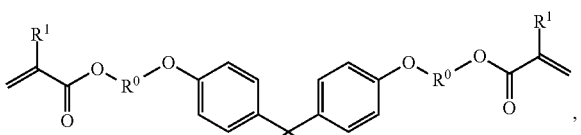
(A6)

and

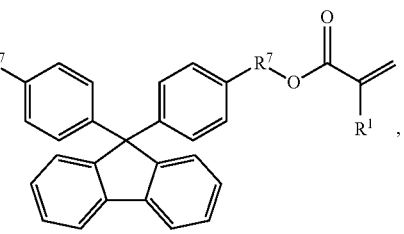
(A7)

wherein $R^1$ is a hydrogen atom or a methyl group $R^0$ is a $C_{1-5}$ alkyl group, $R^7$ is a $C_{1-5}$ alkyl group, $(CH_2CH_2O)_p$ or $(CH_2CH_2CH_2O)_q$ where p is an integer of from 1 to 4 and q is an integer of from 1 to 4.

20. A cured composition obtained by photopolymerizing the photocurable composition of claim 1.

* * * * *